United States Patent [19]

Yoshida et al.

[11] Patent Number: 5,130,498
[45] Date of Patent: Jul. 14, 1992

[54] CERAMIC SUBSTRATE USED FOR FABRICATING ELECTRIC OR ELECTRONIC CIRCUIT

[75] Inventors: Hideaki Yoshida; Yoshirou Kuromitsu; Makoto Toriumi; Michio Yuzawa, all of Saitama, Japan

[73] Assignee: Mitsubishi Metal Corporation, Tokyo, Japan

[21] Appl. No.: 594,596

[22] Filed: Oct. 9, 1990

[30] Foreign Application Priority Data

Oct. 9, 1989 [JP] Japan .................. 1-118588[U]
Oct. 9, 1989 [JP] Japan .................. 1-263710

[51] Int. Cl.⁵ .................................. H05K 1/00
[52] U.S. Cl. .................... 174/252; 174/256; 361/388
[58] Field of Search ............... 174/252, 255, 256, 260; 361/386, 388, 389, 397, 404; 357/81

[56] References Cited

U.S. PATENT DOCUMENTS

3,829,598  8/1974  Darnell ................ 357/81 X
4,791,075 12/1988  Lin ................... 361/404 X

Primary Examiner—Leo P. Picard
Assistant Examiner—Trinidad Korka
Attorney, Agent, or Firm—Sughrue, Mion, Zinn, Macpeak & Seas

[57] ABSTRACT

A ceramic substrate is used for an electric or electronic circuit comprises a ceramic plate formed of a substance mainly composed of aluminum nitride, and conductive islands formed of aluminum or an aluminum alloy and bonded to one surface of the ceramic plate for providing conductive paths to circuit components connected thereto, wherein the aluminum islands decrease the total weight of the ceramic substrate and enhance a resistance against repetition of a thermal stress.

14 Claims, 5 Drawing Sheets

FIG.6

CERAMIC SUBSTRATE USED FOR FABRICATING ELECTRIC OR ELECTRONIC CIRCUIT

FIELD OF THE INVENTION

This invention relates to a ceramic substrate used for an electric or electronic circuit and, more particularly, to a conductive island mounted on a ceramic plate.

BACKGROUND OF THE INVENTION

Figure 1:
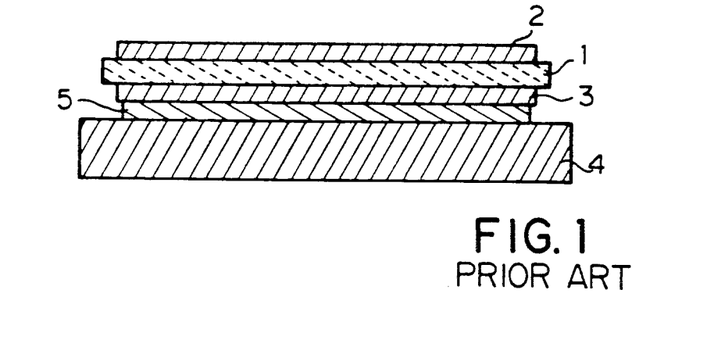
FIG. 1 is a side view showing the structure of the prior art ceramic substrate.

A typical example of the ceramic substrate is illustrated in FIG. 1 and comprises a ceramic plate 1 of aluminum oxide sandwiched between two copper plates 2 and 3, and a heat sink 4. The copper plates 2 and 3 are bonded to both surfaces of the ceramic plate 1 through a liquid phase bonding phenomenon. Namely, the bonding surfaces of the copper plates 2 and 3 are firstly oxidized, and the ceramic plate 1 is laminated with the copper plates 2 and 3 on both surfaces thereof. While the ceramic plate laminated with the copper plates 2 and 3 are heated at 1065 to 1085 degrees in centigrade, the copper and the copper oxide are melted, and the copper plates 2 and 3 are bonded to the ceramic plate 1 through a copper-and-copper oxide eutectic phenomenon. One of the copper plates 2 and 3 provides a conduction path between circuit components, and the other is soldered to the heat sink member 4 at lower than 450 degrees in centigrade.

An electric or electronic circuit is expected to achieve a complex task and is, accordingly, fabricated with a large number of circuit components on a single ceramic substrate. The electric or electronic circuit tends to become heavy, but the manufacturer is requested to decrease the electric or electronic circuit in weight because of a handy sized electronic system. Then, the manufacturer looks for a light ceramic substrate, and a problem is encountered in the prior art ceramic substrate in the weight.

Another problem inherent in the prior art ceramic substrate is a small resistance against repetition of a thermal stress. When the electric or electronic circuit is activated and achieves a task, a large amount of heat is produced in the circuit components, and the ceramic substrate propagates the heat for radiation. Since the copper plates 2 and 3 are different in thermal expansion co-efficient from the ceramic plate 1, the ceramic plate is subjected to thermal stress. Upon being inactivated, no heat takes place, and the ceramic plate is released from the thermal stress. Thus, a heat cycle takes place in the electric or electronic circuit, and, accordingly, the ceramic substrate is repeatedly subjected to the thermal stress. The thermal stress is causative of cracks in the ceramic plate 1, and the ceramic substrate is broken in the worst case.

SUMMARY OF THE INVENTION

It is therefore an important object of the present invention to provide a ceramic substrate which is decreased in weight.

It is another important object of the present invention to provide a ceramic substrate which is large in resistance against the repetition of thermal stress.

Figure 2:
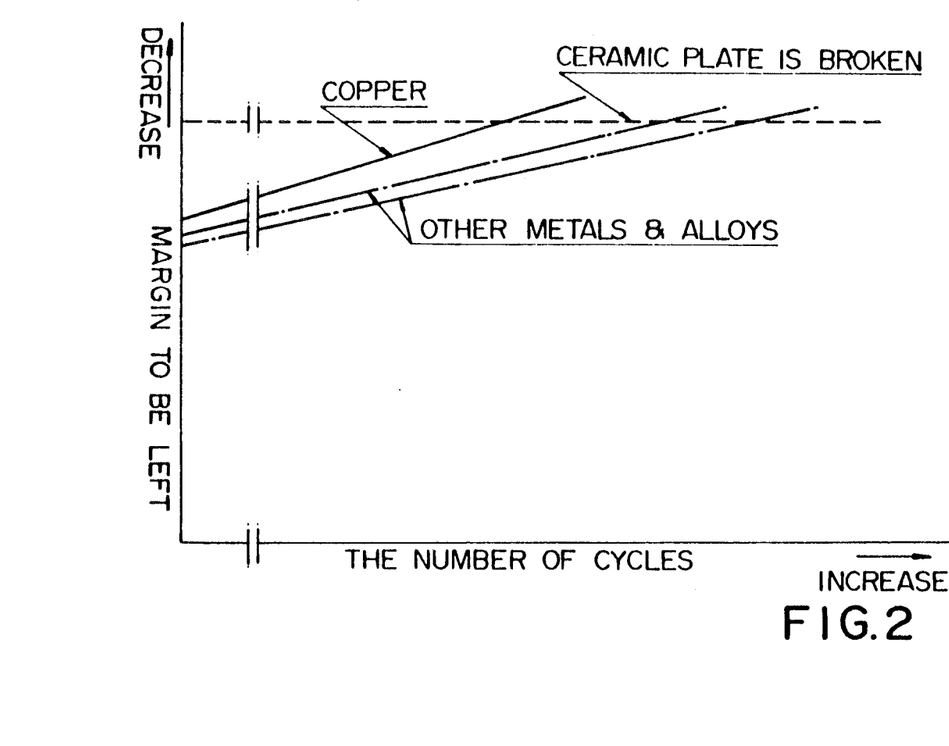
FIG. 2 is a graph showing strength of several metals and alloys in terms of a static load as well as a repeated load.

The inventors found that copper was larger in strength against a static load than some metals and alloys but smaller in fatigue limit against a repeated load than these metals and alloys. Namely, a margin of the strength to be left is rapidly decreased for copper rather than some metals and alloys as shown in FIG. 2. When the repeated load reaches a critical value for breaking the ceramic plate, the margin of some metals and alloys are large enough to support an electric component mounted thereon, but a relatively small amount of margin is merely left for copper. If a conductive island is formed of one of those metals and alloys smaller in specific weight than copper, the problems inherent in the prior art ceramic substrate are solved.

To accomplish these objects, the present invention proposes to form conductive islands of aluminum or an aluminum alloy.

In accordance with the present invention, there is provided a ceramic substrate used for an electric or electronic circuit comprising a) a ceramic plate formed of a substance mainly composed of aluminum nitride, and b) conductive island means bonded to one surface of the ceramic plate and formed of aluminum or an aluminum alloy, the conductive island means providing a conductive path for at least one circuit component connected thereto.

BRIEF DESCRIPTION OF THE DRAWINGS

The features and advantages of a ceramic substrate according to the present invention will be more clearly understood from the following description taken in conjunction with the accompanying drawings in which.

DESCRIPTION OF THE PREFERRED EMBODIMENTS

First Embodiment

Figure 3:
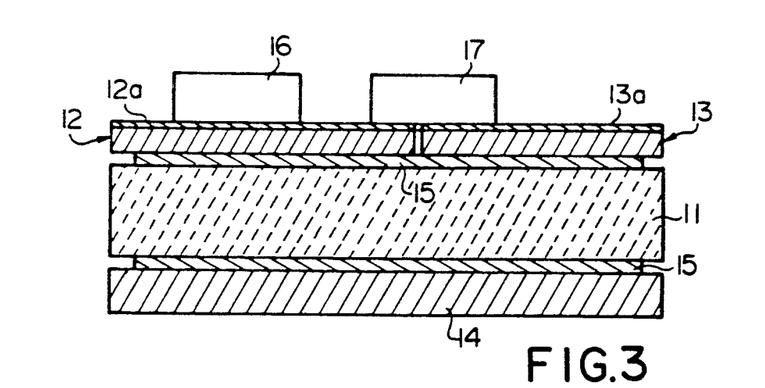
FIG. 3 is a cross sectional view showing the structure of a ceramic substrate according to the present invention.

Referring first to FIG. 3 of the drawings, a ceramic substrate embodying the present invention comprises a ceramic plate 11, conductive metallic islands 12 and 13, and a metallic heat sink 14. The ceramic plate 11 contains about 95% of aluminum nitride (AlN), about 5% of yttrium oxide (Y$_2$O$_3$) and incidental impurities, and the conductive metallic islands 12 and 13 and the metallic heat sink 14 are bonded to both surfaces of the ceramic plate 11 with a solder-bonding alloy 15. The conductive metallic island 12 has a generally rectangular top surface, and the conductive metallic island 12 has a generally L-shaped top surface so as to extend at the back of the conductive metallic island 12. The heat conductivity of aluminum nitride ranges from 50 to 270 watt/(meter × degree in Kelvin) and is larger than that of aluminum oxide ranging between 15 to 20 watt/(meter × degree in Kelvin).

The conductive metallic islands 12 and 13 are electrically isolated from each other and plated with copper or nickel. Circuit components 16 and 17 such as, for example, a discrete semiconductor device and a semiconductor integrated circuit device are respectively soldered to the copper or nickel films 12a and 13a, and the copper or nickel films 12a and 13a improve the adhesion between the circuit components 16 and 17 and the conductive metallic islands 12 and 13. In this instance, the copper or nickel films 12a and 13a cover the entire top surfaces of the conductive metallic islands 12 and 13; however, only the contact areas with the circuit components 12 and 13 may be plated with copper or nickel. Other conductive metal may be available in the plating.

The conductive metallic islands 12 and 13 plated with the copper or nickel are formed of aluminum or an aluminum alloy selected from the group consisting of an aluminum-magnesium-chromium alloy, an aluminum-manganese alloy, an aluminum nickel alloy and an aluminum-boron alloy. Aluminum and the aluminum alloy have large heat conductivities ranging from 150 to 250 watts/(meter × degree in Kelvin). The heat conductivity of aluminum and the aluminum alloy is slightly lower than that of copper (390 watts/(meter × degree in Kelvin)), but aluminum and the aluminum alloy is much smaller in specific weight than copper. The pattern of the conductive metallic islands 12 and 13 as well as the occupation area on the ceramic substrate 11 depend on an electric or electronic circuit, and various arrangements are made for practical ceramic substrates according to the present invention.

The solder-bonding alloy 15 is of an aluminum alloy selected from the group consisting of an aluminum-silicon alloy, an aluminum-silicon-magnesium alloy, an aluminum-germanium alloy and an aluminum-silicon-germanium alloy and shaped in a foil or a cladding sheet together with each of the conductive metallic islands 12 and 13 or the heat sink 14. However, another solder-bonding alloy may be used in so far as the solder-bonding alloy gives a sufficiently large amount of adhesion thereto.

Various specimens are produced in accordance with the present invention. The ceramic plates 11 are about 50 millimeters in width, about 75 millimeters in length and about 0.63 millimeter in thickness. The ceramic is composed of the $Y_2O_3$-5% AlN, but incidental impurities would be contained therein. The metallic heat sinks 14 are about 50 millimeters in width, about 75 millimeters in length and about 3 millimeters in thickness. The conductive metallic islands 12 and 13 and the metallic heat sinks 14 are formed of aluminum or an aluminum alloys. The compositions of the aluminum alloys are described in Table 1. The metallic heat sinks 14 and the conductive metallic islands 12 and 13 are prepared through a rolling process, and several islands and heat sinks are simultaneously clad with the solder-bonding alloys 15. The solder-bonding alloys 15 thus clad are about 30 microns in thickness, and the solder-bonding alloys 15 in the form of foil are also prepared and used in the other specimens. The compositions of the solder-bonding alloys 15 are shown in Table 1.

Each of the ceramic plates 11 is laminated with the associated heat sink 14 and the islands 12 and 13 at both surfaces thereof, and the foil-shaped solder-bonding alloy 15 intervenes between the ceramic plate 11 and either heat sink 14 or conductive metallic islands 12 and 13, if necessary. All of the ceramic plates 11 thus laminated with the associated component layers are heated in vacuum to a melting temperature of the solder-bonding alloys ranging from 430 degrees to 610 degrees in centigrade and, then, maintained for about 10 minutes. Each of the ceramic plates 11 is bonded to the associated metallic heat sink 14 and the associated conductive metallic islands 12 and 13. The laminated structures thus bonded are further maintained at 350 degrees in centigrade for 30 minutes for heat treatment and, then, gradually cooled in the furnace. Finally, the islands 12 and 13 are plated with copper or nickel to a thickness of about 3 micron through an electroless plating process. Specimens 1 to 10 are, thus, fabricated in accordance with the present invention.

For comparison, the prior art ceramic substrate is fabricated and shown in Table 1 with reference numeral "11". Namely, the ceramic plate 1 is formed of aluminum oxide ($Al_2O_3$) with purity of 96%, the dimensions thereof are 50 millimeters in width, 75 millimeters in length and 0.63 millimeter in thickness. On both surfaces of the ceramic plate 1 are placed oxygen free copper plates 2 and 3 each being 45 millimeters in width, 70 millimeters in length and 0.3 millimeter in thickness. The ceramic plate 1 sandwiched between the oxygen free copper plates 2 and 3 is placed in an oxidizing ambience consisting of 1%-oxygen and 99%-argon at 1075 degrees in centigrade for 50 minutes. The copper plates 2 and 3 are oxidized, and copper oxide ($Cu_2O$) is produced on the surfaces thereof. Since the copper and the copper oxide form an eutectic mixture, the copper plates 2 and 3 are bonded to the ceramic plate 1. A foil-shaped Sn-60% Pb solder-bonding alloy 5 is placed between the copper plate 3 and the heat sink 4 which is 50 millimeters in width, 75 millimeters in length and 3 millimeters in thickness. The heat sink 4 is formed of oxygen free copper. The foil-shaped solder-bonding alloy 5 is heated to an appropriate high temperature, and the heat sink 4 is soldered to the copper plate 3.

TABLE 1

| | Composition | | | |
| Specimen | Heat Sink (weight %) | Islands (weight %) | Solder (weight %) | Form |
| --- | --- | --- | --- | --- |
| 1 | pure Al | pure Al | Si-13% Al alloy | Foil |
| 2 | Mg-2.5%, Cr-0.2% Al alloy | " | " | " |
| 3 | Mg-2.5%, Cr-0.2% Al alloy | " | Si-7.5% Al alloy | " |
| 4 | Mn-1% Al alloy | Mn-1% Al alloy | Ge-15% Al alloy | " |
| 5 | Mn-1% Al alloy | pure Al | Si-9.5%, Mg-1% Al alloy | Clad |
| 6 | pure Al | " | Si-9.5%, Mg-1% Al alloy | " |
| 7 | " | " | Si-7.5%, Ge-10% Al alloy | " |
| 8 | " | Mn-1% Al alloy | Si-7.5%, Ge-10% Al alloy | " |
| 9 | Ni-0.02% Al alloy | Ni-0.02% Al alloy | Si-7.5% Al alloy | Foil |
| 10 | B-0.005% Al alloy | B-0.005% Al alloy | Si-7.5% Al alloy | " |
| 11 | Cu | Cu | Cu—$Cu_2O$ | |

The specimens 1 to 11 are heated to 125 degrees in centigrade t and, then, cooled down to −55 degrees in centigrade. The temperature elevation followed by the cooling-down forms a heat cycle, and the heat cycle is repeated until cracks take place in the ceramic plates 1 or 11. The evaluation process is well known in the semiconductor manufacturer. In the evaluation, the heat cycle is repeated twenty times, and the ceramic plates 1 and 11 are observed if any crack takes place or not. If no crack takes place, the heat cycle is repeated twenty times again. The observation is summarized in Table 2.

The heat conductivity of each of the specimens 1 to 11 is measured through a laser-flashing method, and a weight ratio with respect to the prior art ceramic substrate is calculated for each of the specimens 1 to 10. The heat conductivity and the weight ratio are shown in Table 2. In Table 2, "degrees in Kelvin" is abbreviated as "deg.in Kvn".

TABLE 2

| Specimen | The number of heat cycles | Heat conductivity (W/meter × deg. in Kvn.) | Weight ratio |
|---|---|---|---|
| 1 | 200 without crack | 159 | 0.354 |
| 2 | " | 132 | 0.353 |
| 3 | " | 135 | 0.353 |
| 4 | " | 140 | 0.353 |
| 5 | " | 150 | 0.352 |
| 6 | " | 158 | 0.352 |
| 7 | " | 146 | 0.352 |
| 8 | " | 139 | 0.352 |
| 9 | " | 157 | 0.354 |
| 10 | " | 157 | 0.354 |
| 11 | 20 with cracks | 160 | 1 |

As will be understood from Table 1, the ceramic substrate according to the present invention is increased in resistance against repetition of heat cycle and decreased in weight. This is because of the fact that the ceramic substrate is fabricated with the combination the ceramic plate 11 of aluminum nitride and the conductive metallic islands 12 and 13 of aluminum or the aluminum alloy.

In general, it is desirable to be large in thickness in view of the current propagation. However, the thick conductive metallic islands 12 and 13 are causative of large a stress exerted on the ceramic plate 11, because a large distance from the neutral surface allows a large moment to take place. Then, a thin conductive metallic islands 12 and 13 are desirable in view of the service time period. The ratio of the thickness t1 of each island to the thickness t2 of the ceramic plate 11 should be smaller than a critical value, and the sectional area of each island is compensated by either width or length.

Figure 4:
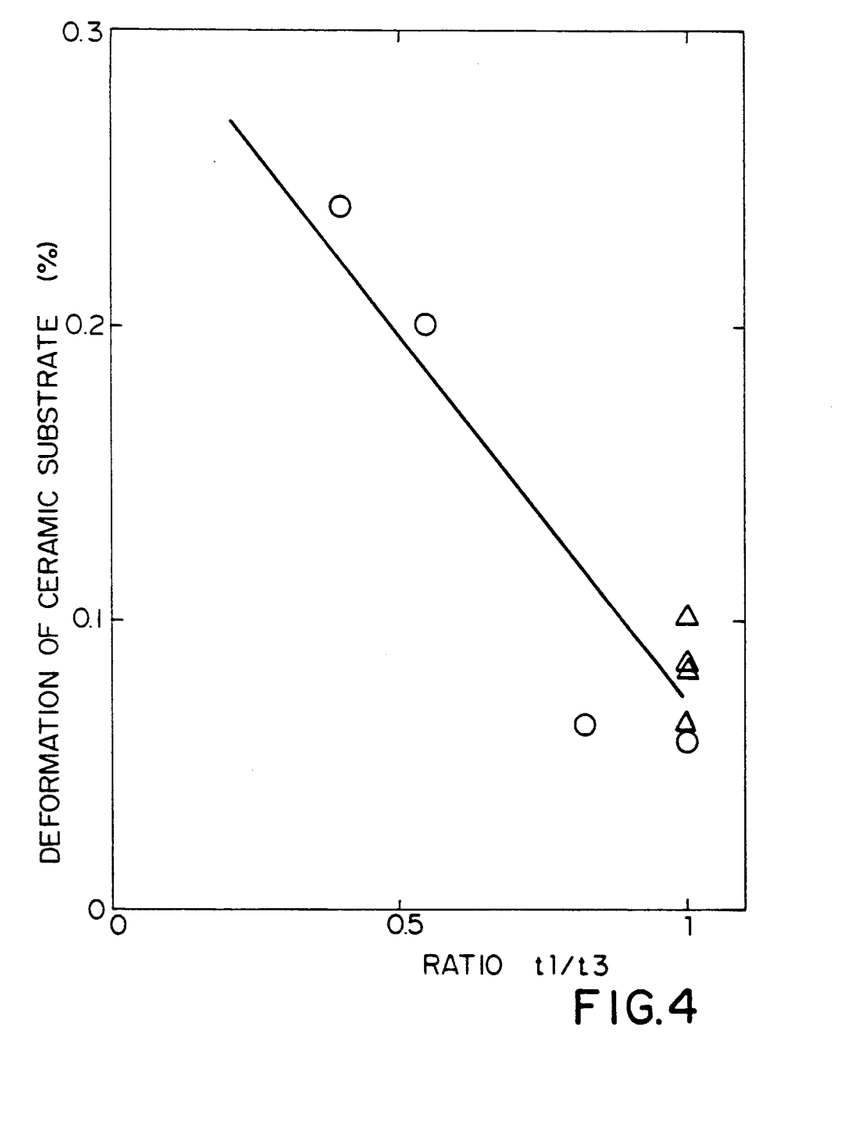
FIG. 4 is a graph showing the deformation of ceramic substrate in terms of a ratio of thicknesses between each conductive metallic island and a metallic heat sink.

If a ceramic plate is sandwiched between conductive metallic islands and a metallic heat sink, a part of moment caused by the conductive metallic islands is canceled by a counter-moment caused by the metallic heat sink. This mean that the thickness t1 of each island is well balanced with the thickness t3 of the heat sink at a certain point. If the thicknesses t1 and t3 are appropriately selected, the ceramic substrate provides a long serves time without deterioration of reliability. FIG. 4 shows the deformation of a ceramic substrate in terms of the ratio t1/t3. Although an experiment is carried out with the ceramic plates formed of the aluminum oxide, the same tendency takes place in an experiment using aluminum nitride plates. Triangular plots stand for ceramic substrates of 4-inches square, and bubbles represent ceramic substrates each being 30 millimeters in width and 70 millimeters in length. All of the ceramic substrates are 0.635 millimeter in thickness, and the both surfaces of each aluminum oxide plate is sandwiched between two aluminum plates. The heat cycle exerted on the ceramic substrates reiterates a loop between +125 degrees in centigrade for 30 minutes and −40 degrees in centigrade for 30 minutes. The application of the heat cycles warps the ceramic substrates due to the difference between the moment and the counter-moment opposite in direction thereto. The minimum deformation takes place at the ratio of t1/t3=1 as shown in FIG. 4, and the minimum deformation at t1/t3=1 well supports the existence of the balancing point, because moment is balanced with the counter moment. If the occupation area of the conductive metallic islands is decreased, the balancing point is moved from the ratio t1/t3=1, and the adjustment of the ratio to the balancing point prolongs the service time period.

Figure 5:
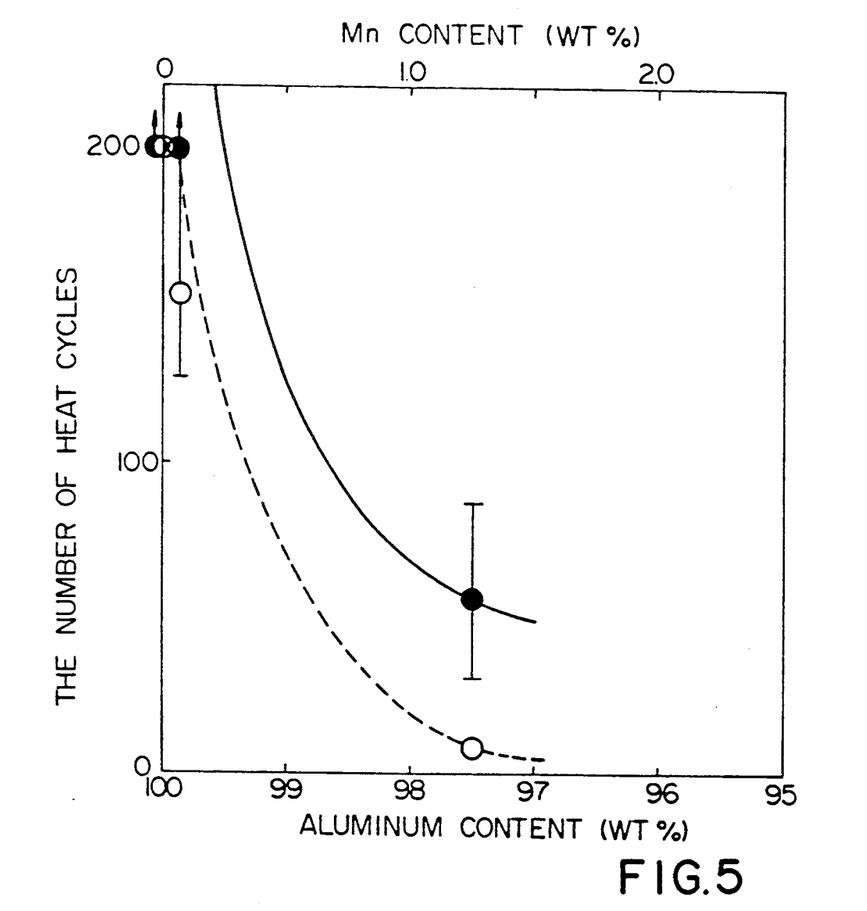
FIG. 5 is a graph showing the number of heat cycles exerted on a ceramic substrate in terms of an aluminum content.

The aluminum content of the islands and the heat sink has an influence on the resistance against the repetition of heat cycle. FIG. 5 shows the number of heat cycles exerted on the ceramic substrate in terms of the aluminum content. Bubbles stand for the ceramic substrates without any annealing after the bonding between the ceramic plate and the aluminum plates, and dots represent the ceramic substrates fabricated through the bonding followed by an annealing at 400 degrees in centigrade for 6 hours. All of the ceramic substrates are shaped in to a rectangular configuration of 1 inch by 1 inch, and the thickness is about 0.4 millimeter. If the manganese content is increased, the resistance is decreased, but the resistance is improved through the annealing. If an aluminum alloy is used for the islands 12 and 13 and the heat sink 14, an appropriate annealing should be carried out for healing the resistance against the repetition of heat cycle.

Second Embodiment

Figure 6:
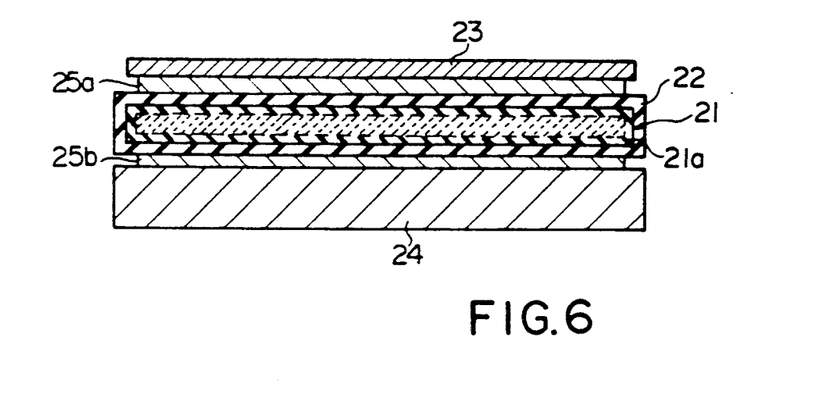
FIG. 6 is a cross sectional view showing the structure of another ceramic substrate according to the present invention.

Turning to FIG. 6 of the drawings, another ceramic substrate according to the present invention comprises a ceramic plate 21 mainly composed of aluminum nitride and covered with an aluminum oxide film 21a, a surface film 22 covering the aluminum oxide film 21a, a conductive metallic island pattern 23, a metallic heat sink 24, and solder-bonding alloy blocks 25a and 25b bonding the conductive metallic island pattern 23 and the metallic heat sink 24 to both surfaces of the ceramic plate 21. In this instance, the ceramic plate 21 is formed of aluminum nitride containing one of more than one oxidizers; however, a pure aluminum nitride may be used for the ceramic plate 21. The oxidizers range from 0.1% to 10% by weight in this instance, and the aluminum oxide film 21a is 0.2 micron to 20 microns in thickness.

Aluminum powder containing the oxidizers is sintered to produce the ceramic plate 21, and the oxidizer improves the density of the sintered product or the ceramic plate 21. The large density results in a large mechanical strength, and the ceramic substrate according to the present invention is less liable to be broken. The oxidizer or oxidizers further promote oxidation of the surface portion of the ceramic plate 21 so as to rapidly form the aluminum oxide film 21a. If the oxidizer or oxidizers are less than 0.1% by weight, the improvement in density is hardly achieved, and no rapid oxidation takes place. However, the oxidizer or oxidizers more than 10% by weight deteriorate the heat conductivity of the ceramic plate 21, and, for this reason, the content of the oxidizer or oxidizers ranges from 0.1% to 10% by weight.

The aluminum oxide film 21a is formed through a surface oxidation of the ceramic plate 21, and the surface oxidation is carried out at 1100 degrees to 1500 degrees in centigrade in an oxidizing ambience where the oxygen partial pressure ranges from $10^{-2}$ to 1 atm and the water vapor pressure is less than $10^{-3}$ atm. The time period of the oxidation depends upon the thickness of the aluminum oxide film 21a. The advantage of the aluminum oxide film 21a will be described in connection with the surface film. However, if the aluminum oxide film 21a is less than 0.2 micron, the advantage hardly takes place, and an aluminum oxide film more than 20 microns deteriorates the heat conductivity of the ceramic plate 21.

The conductive metallic island pattern 23 and the heat sink 24 are formed of aluminum or an aluminum alloy selected from the group consisting of an aluminum-manganese alloy, an aluminum-nickel alloy, an aluminum-magnesium-chromium alloy and aluminum boron alloy. The top surface of the conductive metallic island patter 23 is partially plates with copper or nickel so that circuit components (not shown) are easily soldered thereto.

The solder-bonding alloy is selected from the group consisting of an aluminum-silicon alloy, an aluminum-silicon-magnesium alloy, an aluminum-silicon-germanium alloy and an aluminum germanium alloy. The solder-bonding alloy is shaped into a foil, or the conductive metallic island pattern 23 and the metallic heat sink 24 are clad with the solder-bonding alloy. The solder-bonding alloy blocks 25a and 25b are melted in an appropriate high temperature over its melting point, and, accordingly, the ceramic plate 21 covered with the surface film 22 is bonded to the conductive metallic island pattern 23 and the metallic heat sink 24.

The surface film 22 is mainly composed of silicon oxide ($SiO_2$) or of the silicon oxide containing zirconium oxide or titanium oxide. The surface film 22 and the aluminum oxide film 21a improve the adhesion between the ceramic plate 21 and the conductive metallic island pattern and between the ceramic plate 21 and the metallic heat sink 24. This is because of the fact that both of the aluminum oxide and the solder-bonding alloy are well wet with the silicon oxide. The surface film 22 ranges from 0.01 micron to 10 microns in thickness. If the surface film 22 is less than 0.01 micron in thickness, the adhesion is hardly improved. The surface film 22 greater than 10 microns deteriorates the heat conductivity. Thus, the surface film 22 should be adjusted between 0.01 micron and 10 microns. The surface film 22 of the silicon oxide surely improves the adhesion; however, if the surface film 22 contains the zirconium oxide or the titanium oxide, the adhesion as well as the strength thereof are further improved, and, accordingly, the ceramic substrate is increased in the resistance against the repetition of the heat cycle. Either zirconium oxide or titanium oxide ranges from 1% to 50% by weight.

If the surface film 22 is formed of silicon oxide, the silicon oxide is deposited through a high-frequency sputtering process. In the sputtering process, the target is formed of quartz with purity of 99.9%, and the dimensions of the target are 3 millimeters in diameter and 10 millimeters in height. The sputtering is carried out at 100 watts, and the ceramic plate 21 is driven for rotation at 10 rpm. A sol-gel process is also available for the surface film 22. The sol-gel process starts with preparation of a solution where 347 grams of ethylsilicate is mixed into 500 grams of ethylalcohol and 190.2 grams of 0.3% hydrochloride diluted in water. The solution is sprayed on the ceramic plate 22 for 10 seconds, and the ceramic plate 22 is driven for rotation at 500 rpm. The ceramic plate 22 is, then, placed at 800 degrees in centigrade for 10 minutes so that an extremely thin silicon oxide film is produced on the ceramic plate 22. The sol-gel process thus carried out is repeated until the surface film 22 reaches a predetermined thickness. Another process available is a photo-assisted chemical vapor deposition process. The ceramic plate 22 is placed in a reacting chamber of a photo-assisted chemical vapor deposition system, and the reacting chamber is evacuated to 0.2 torr. A gaseous mixture of $Si_2H_6$ and $O_2$ is introduced in the reacting chamber, and $Si_2H_6$ is regulated to 0.015% by volume. A chemical reaction takes plate under the photo radiation from a mercury lamp, and the silicon oxide is deposited on the ceramic plate 22. The aforementioned three processes are also available for the surface film 22 containing the zirconium oxide or the titanium oxide.

Various specimens are produced in accordance with the present invention. Powder of aluminum nitride, powder of yttrium oxide ($Y_2O_3$) and powder of calcium oxide (CaO) are prepared, and the powders are about 1 to 3 microns in average diameter. The powders are regulated to respective proportions shown in Table 3, and the individual mixtures are mixed in a wet ball mill for 72 hours. After drying, an organic binder is added to the individual mixtures and mixed well so as to produce respective pastes. The pastes thus obtained are formed into respective green sheets through the doctor blade technique, and the green sheets are sintered in an atmospheric ambience of nitrogen at 1800 degrees in centigrade for 2 hours. The ceramic plates 22 thus sintered are substantially identical in composition with the mixtures, respectively, and the dimensions of each ceramic plate are 50 millimeters in width, 75 millimeters in length and 0.63 millimeter in thickness. The ceramic plates 22 are oxidized in an oxidizing ambience at 1350 degrees to 1450 degrees in centigrade for respective time periods depending upon the thickness of the aluminum oxide films 21a. The oxidizing ambience has a partial pressure of $1 \times 10^{-5}$ to $1 \times 10^{-3}$ atm, and the average thickness of each aluminum oxide film 21a is shown in Table 3. The surface films 22 are respectively deposited on the aluminum oxide films 21a through either high-frequency sputtering process, sol-gel process or photo-assisted chemical vapor deposition process, and the composition and the thickness of each surface film 22 are shown in Table 3.

TABLE 3

| Specimen | Ceramic plate (wt %) | | | Oxide (micron) | Surface film (wt %) | | | Thick (micron) |
|---|---|---|---|---|---|---|---|---|
| | $Y_2O_3$ | CaO | AlN | | $ZrO_2$ | $TiO_2$ | $SiO_2$ | |
| 21 | 0.1 | — | residue | 0.5 | 40.3 | — | residue | 0.2 |
| 22 | 0.5 | — | residue | 3.2 | — | 35.4 | residue | 0.05 |
| 23 | 1.5 | — | residue | 14.3 | 30.2 | — | residue | 3.0 |
| 24 | 2.5 | — | residue | 5.8 | — | 15.1 | residue | 0.8 |
| 25 | 5 | — | residue | 4.0 | — | — | 100 | 6.8 |
| 26 | 7 | — | residue | 0.2 | — | 1.6 | residue | 1.2 |
| 27 | 9 | — | residue | 1.2 | — | — | 100 | 0.5 |
| 28 | 10 | — | residue | 11.3 | 1.2 | — | residue | 0.4 |
| 29 | — | 0.1 | residue | 6.2 | — | 47.6 | residue | 0.01 |
| 30 | — | 1 | residue | 2.4 | — | — | 100 | 8.7 |
| 31 | — | 2.5 | residue | 0.5 | 10.3 | — | residue | 3.1 |

TABLE 3-continued

| Speci-men | Ceramic plate (wt %) | | | Oxide (micron) | Surface film (wt %) | | | Thick (micron) |
|---|---|---|---|---|---|---|---|---|
| | $Y_2O_3$ | CaO | AlN | | $ZrO_2$ | $TiO_2$ | $SiO_2$ | |
| 32 | — | 4 | residue | 10.2 | — | 20.5 | residue | 0.1 |
| 33 | — | 5 | residue | 1.3 | 20.6 | — | residue | 0.5 |
| 34 | — | 6.5 | residue | 7.8 | — | — | 100 | 0.9 |
| 35 | — | 8 | residue | 12.6 | — | 5.4 | residue | 1.5 |
| 36 | — | 9.5 | residue | 4.3 | — | — | 100 | 0.6 |
| 37 | 0.1 | 0.1 | residue | 0.3 | — | — | 100 | 2.4 |
| 38 | 1 | 1 | residue | 2.3 | — | — | 100 | 0.32 |
| 39 | 0.5 | 2 | residue | 15.4 | 6.8 | — | residue | 0.05 |
| 40 | 3 | 1 | residue | 5.2 | — | 10.4 | residue | 0.8 |
| 41 | 4 | 2 | residue | 8.8 | — | — | 100 | 9.6 |
| 42 | 3 | 5 | residue | 19.6 | — | 2.1 | residue | 0.3 |

The conductive metallic island patterns 23 are shaped into the dimensions of 45 millimeters in width, 70 millimeters in length and 1 millimeter in thickness, and the metallic heat sinks 24 are 50 millimeters, in width, 75 millimeters in length and 3 millimeters in thickness. The conductive metallic island patterns 23 and the metallic heat sinks 24 are formed of pure aluminum and aluminum alloys as shown in Table 4. In Table 4, the pure aluminum is abbreviated as "AL", and Mg-2.5% Cr-0.2% aluminum alloy, Mn-0.1% aluminum alloy, Ni-0.02% aluminum alloy and B-0.005% aluminum alloy are respectively abbreviated as "Al-Mg-Cr", "Al-Mn", "Al-Ni" and "Al-B".

Following solder-bonding alloys are used for fabricating specimens 21 to 42:

1) Si-13% aluminum alloy (abbreviated as "Al-13Si" in Table 4)
2) Si-7.5% aluminum alloy (abbreviated as "Al-7.5Si")
3) Ge-15% aluminum alloy (abbreviated as "Al-Ge")
4) Si-9.5% Mg-1% aluminum alloy (abbreviated as "Al-Si-Mg")
5) Si-7.5% Ge-10% aluminum alloy (abbreviated as "Al-Si-Ge")

The solder-bonding alloys 1 to 3 are formed in a foil of 50 microns thick, or each of the conductive metallic island patterns 23 and the metallic heat sinks 24 is clad with either solder-bonding alloy 4 or 5 of 30 microns.

Each of the ceramic plates 21 covered with the surface film 22 is laminated with the conductive metallic island pattern 23, the metallic heat sink 24 and the solder-bonding alloy films, if necessary, and is placed in vacuum at 430 to 610 degrees in centigrade for 10 minutes. Then, each of the ceramic plate 21 is bonded to the conductive metallic island pattern 23 and the metallic heat sink 24, and is annealed at 350 degrees in centigrade for 30 minutes, then being gradually cooled to room temperature in the furnace. The conductive metallic island patterns 23 are, the, plated with copper or nickel to a thickness of about 3 micron through an electroless plating process.

For comparison, a prior art ceramic substrate PR is fabricated by using an aluminum oxide plate with purity of 96%, and the dimensions thereof are 50 millimeters in width, 75 millimeters in length and 0.63 millimeter in thickness. The aluminum oxide plate is sandwiched between oxygen free copper plates of 45 millimeters in width, 70 millimeters in length and 0.3 millimeter in thickness. When the aluminum oxide plate thus sandwiched between the oxygen free copper plates are placed in an argon ambience containing 1% oxygen at 1075 degrees in centigrade for 50 minutes, then the oxidized copper ($Cu_2O$) reacts in liquid phase with copper so that an eutectic alloy is formed for bonding to the aluminum oxide plate. A foil-shaped Sn-60% Pb alloy is sandwiched between one of the copper plates and a heat sink of an oxygen free copper. The heat sink if 50 millimeters in width, 75 millimeters in length and 3 millimeters in thickness.

TABLE 4

| Speci-men | Heat sink | Island pattern | Solder | |
|---|---|---|---|---|
| | | | Form | Alloy |
| 21 | Al—Mn | Al | Foil | Al—7.5Si |
| 22 | Al | Al—Mn | " | Al—Ge |
| 23 | Al—Mg—Cr | Al | Clad | Al—Si—Mg |
| 24 | Al | Al | Foil | Al—13Si |
| 25 | Al—Ni | Al—Ni | " | Al—15Si |
| 26 | Al | Al—Ni | Clad | Al—Si—Mg |
| 27 | Al—B | Al—B | Clad | Al—Si—Ge |
| 28 | Al | Al—Mn | Foil | Al—7.5Si |
| 29 | Al | Al | Clad | Al—Si—Mg |
| 30 | Al—Mg—Cr | Al—Mn | Foil | Al—7.5Si |
| 31 | Al—Mn | Al—Mn | Clad | Al—Si—Ge |
| 32 | Al—B | Al—B | Foil | Al—7.5Si |
| 33 | Al | Al | Clad | Al—Si—Ge |
| 34 | Al | Al—Mn | Foil | Al—13Si |
| 35 | Al—Mg—Cr | Al | " | Al—Ge |
| 36 | Al—Ni | Al | Clad | Al—Si—Mg |
| 37 | Al—B | Al—B | Foil | Al—7.5Si |
| 38 | Al—Ni | Al—Ni | Foil | Al—7.5Si |
| 39 | Al | Al | " | Al—Ge |
| 40 | Al—Mn | Al—Mn | " | Al—15Si |
| 41 | Al | " | Clad | Al—Si—Mg |
| 42 | Al—Mg—Cr | " | Foil | Al—Ge |
| PR | Cu | Cu | | Cu—$Cu_2O$ |

Specimens 21 to 42 and the prior art ceramic substrate PR are subjected to heat cycle between 125 degrees in centigrade and −55 degrees in centigrade for evaluation, and the heat cycle is repeated twenty times. After the twenty heat cycles, specimens 21 to 42 and the prior art ceramic substrate are observed to see whether or not any crack takes place. If not, the specimens are subjected to the heat cycles twenty times again. The results are described in Table 5. Heat conductivity is measured for each specimen as well as the prior art ceramic substrate through a laser flashing method, and a bonding strength is further measured as shown in Table 5. Assuming that the prior art ceramic substrate has a unit weight "1", the weight ratio is calculated for each specimen.

TABLE 5

| Speci-men | The number of heat cycles | Heat conductivity (w/meter deg. in Kvn) | Bonding strength (kg/mm²) | Weight ratio |
|---|---|---|---|---|
| 21 | 200 without crack | 148 | more than 2 | 0.353 |
| 22 | " | 140 | " | 0.352 |
| 23 | " | 134 | " | 0.353 |
| 24 | " | 159 | " | 0.352 |
| 25 | " | 158 | " | 0.354 |
| 26 | " | 151 | " | 0.353 |

TABLE 5-continued

| Specimen | The number of heat cycles | Heat conductivity (w/meter deg. in Kvn) | Bonding strength (kg/mm²) | Weight ratio |
| --- | --- | --- | --- | --- |
| 27 | " | 156 | " | 0.354 |
| 28 | " | 149 | " | 0.352 |
| 29 | " | 158 | " | 0.352 |
| 30 | " | 137 | " | 0.354 |
| 31 | " | 135 | " | 0.353 |
| 32 | " | 159 | " | 0.354 |
| 33 | " | 157 | " | 0.352 |
| 34 | " | 150 | " | 0.352 |
| 35 | " | 142 | " | 0.353 |
| 36 | " | 151 | " | 0.353 |
| 37 | " | 159 | " | 0.354 |
| 38 | " | 158 | " | 0.354 |
| 39 | " | 157 | " | 0.352 |
| 40 | " | 144 | " | 0.354 |
| 41 | " | 146 | " | 0.352 |
| 42 | " | 133 | " | 0.354 |
| PR | 20 with cracks | 160 | " | 1 |

As will be understood from Table 5, the ceramic substrate according to the present invention is as large in heat conductivity and the bonding strength as the prior art ceramic substrate, and is improved in weight and resistance against repetition of heat cycle. FIGS. 4 and 5 are applicable to the ceramic substrate shown in FIG. 6, and the design work is carried out in consideration of the tendencies described with reference to FIGS. 4 and 5. This is conducive to fabricate a further improved ceramic substrate.

Although particular embodiments of the present invention have been shown and described, it will be obvious to those skilled in the art that various changes and modifications may be made without departing from the spirit and scope of the present invention. For example, another aluminum alloy may be available for the metallic heat sink 14 and the conductive metallic islands 12 and 13 in so far as the aluminum alloy is larger in the fatigue limit against a repeated load than copper and smaller in the specific weight than copper. The candidates are an Al-B alloy, an Al-Bi alloy, and Al-Ca alloy, and Al-Cd alloy, and Al-Ce alloy, an Al-Cr alloy, an Al-Cu alloy, an Al-Fe alloy, an Al-Ga alloy, an Al-In alloy, and Al-La alloy, and Al-Li alloy, an Al-Mn alloy, an Al-Mg alloy, an Al-Mo alloy, an Al-Nb alloy, an Al-Ni alloy, an Al-Pb alloy, an Al-Pd alloy, an Al-Pt alloy, an Al-Sb alloy, an Al-Si alloy, an Al-Ti alloy, an Al-Sn alloy, an Al-V alloy, an Al-W alloy, an Al-Y alloy, an Al-Zn alloy and an Al-Ze alloy. Moreover, all of the embodiments are equipped with the heat sinks. However, another ceramic substrate according to the present invention may not be equipped with any heat sink.

What is claimed is:

1. A ceramic substrate used of ran electric or electronic circuit comprising
   a) a ceramic plate formed of a substance mainly composed of aluminum nitride,
   b) conductive island means bonded to one surface of said ceramic plate and formed of a substance selected from the group consisting of aluminum and an aluminum alloy, said conductive island means providing a conductive path for at least one circuit component connected thereto, and
   c) a bonding layer provided between said ceramic plate and said conductive island means for soldering the conductive island means to the ceramic plate, said bonding layer being formed of a substance selected from the group consisting of an aluminum-silicon alloy, an aluminum-germanium alloy, an aluminum-silicon-magnesium alloy and an aluminum-silicon-germanium alloy.

2. A ceramic substrate as set forth in claim 1, in which said aluminum alloy is selected from the group consisting of an aluminum-manganese alloy, an aluminum-nickel alloy and an aluminum-boron alloy.

3. A ceramic substrate as set forth in claim 1, in which said conductive island means has a top surface covered with a conductive metallic film of copper or nickel.

4. A ceramic substrate as set forth in claim 1, in which said conductive island means has a top surface partially covered with a conductive metallic film of copper or nickel.

5. A ceramic plate as set forth in claim 1, in which said ceramic plate contains one or more than one kind of oxidizer selected from the group consisting of yttrium oxide, calcium oxide and magnesium oxide.

6. A ceramic substrate as set forth in claim 7, in which said one or more than one kind of oxidizer ranges from 0.1% to 10% by weight.

7. A ceramic substrate as set forth in claim 6, in which said ceramic plate has an oxidized top surface portion with thickness ranging from 0.2 micron to 20 microns.

8. A ceramic substrate as set forth in claim 7, in which said oxidized top surface portion of said ceramic plate is overlain by a surface film mainly composed of silicon oxide and having a thickness ranging from 0.01 micron to 10 microns.

9. A ceramic substrate as set forth in claim 7, in which said oxidized top surface portion of said ceramic plate is overlain by a surface film containing silicon oxide, zirconium oxide ranging from about 1% to about 50% by weight and incidental impurities.

10. A ceramic substrate as set forth in claim 7, in which said oxidized top surface portion of said ceramic plate is overlain by a surface film containing silicon oxide, titanium oxide ranging from about 1% to about 50% by weight and incidental impurities.

11. A ceramic substrate as set forth in claim 1, in which said ceramic substrate further comprises a heat sink bonded to the other surface of said ceramic plate.

12. A ceramic substrate as set forth in claim 11, in which said heat sink is formed of a substance selected from the group consisting of aluminum and an aluminum alloy.

13. A ceramic substrate as set forth in claim 12, in which said aluminum alloy is selected from the group consisting of an aluminum-manganese alloy, an aluminum-magnesium-chromium alloy, an aluminum-nickel alloy and an aluminum-boron alloy.

14. A ceramic substrate as set forth in claim 13, in which said heat sink is soldered to said ceramic plate by means of a bonding layer formed of a substance selected from the group consisting of an aluminum-silicon alloy and an aluminum-germanium alloy.

* * * * *